United States Patent [19]

Yamada

[11] Patent Number: 5,247,554
[45] Date of Patent: Sep. 21, 1993

[54] CHARGE DETECTION CIRCUIT

[75] Inventor: Tetsuo Yamada, Yokohama, Japan

[73] Assignee: Kabushiki Kaisha Toshiba, Kawasaki, Japan

[21] Appl. No.: 462,860

[22] Filed: Jan. 5, 1990

Related U.S. Application Data

[62] Division of Ser. No. 144,339, Jan. 15, 1988, abandoned.

[30] Foreign Application Priority Data

Jan. 16, 1987 [JP] Japan ................................... 62-7841

[51] Int. Cl.⁵ ...................... G11C 19/28; H01L 29/78
[52] U.S. Cl. ...................................... 377/60; 377/58; 377/63; 257/239
[58] Field of Search .................. 377/57, 58, 60, 61-63, 377/59; 357/24, 24 M; 307/296 R, 297

[56] References Cited

U.S. PATENT DOCUMENTS

| | | | |
|---|---|---|---|
| 4,139,784 | 2/1979 | Sauer | 377/57 |
| 4,156,818 | 5/1979 | Collins et al. | 377/58 |
| 4,166,223 | 8/1979 | Bluzer | 377/60 |
| 4,191,895 | 3/1980 | Levine et al. | 377/58 |
| 4,528,864 | 7/1985 | Iida et al. | 377/60 |
| 4,621,369 | 11/1986 | Narabu et al. | 377/60 |
| 4,625,322 | 11/1986 | Tukazaki et al. | 377/58 |
| 4,646,119 | 2/1987 | Kosonocky | 357/24 |
| 4,683,580 | 7/1987 | Matsunaga | 377/60 |
| 4,739,240 | 6/1973 | Krambeck | 377/58 |
| 4,896,340 | 1/1990 | Caro | 377/60 |
| 4,974,240 | 11/1990 | Suzuki et al. | 377/60 |

FOREIGN PATENT DOCUMENTS

| | | | |
|---|---|---|---|
| 0192142 | 8/1986 | European Pat. Off. | 357/24 |
| 0106867 | 6/1983 | Japan | 357/24 |
| 59-11680 | 1/1984 | Japan | 377/60 |

OTHER PUBLICATIONS

J. Millman—"MicroElectronics"—McGraw-Hill Book Company—1979—pp. 397-400.
Patent Abstracts of Japan, vol. 10, No. 192 (E-417) [2248], 5th Jul. 1985; and JP-A-61 35 560 (Hitachi LTD) Feb. 20, 1986.

*Primary Examiner*—William L. Sikes
*Assistant Examiner*—Tai V. Doung
*Attorney, Agent, or Firm*—Finnegan, Henderson, Farabow, Garrett & Dunner

[57] ABSTRACT

A charge detection circuit includes a p-type semiconductor substrate, a reference voltage source for generating a reference voltage having a predetermined voltage difference with respect to the potential of the semiconductor substrate, a first $n^+$-type semiconductor region formed in the semiconductor substrate, for storing a carrier packet, a second $n^+$-type semiconductor region formed in the semiconductor substrate and connected to the reference voltage source so as to be kept at a potential substantially equal to the reference potential, an MIS type transfer gate having a channel formed between the first and second semiconductor regions, and a gate electrode insulatively formed over the channel to transfer the carrier packet from the first semiconductor region to the second semiconductor region, a potential detection circuit for detecting the potential of the first semiconductor region, which potential is determined by the amount of carriers in the carrier packet, a signal supply section for supplying a control potential signal to the gate electrode, to control the conduction state of the transfer gate, and a biasing circuit for biasing the potential of the gate electrode according to a preset offset potential. The biasing circuit has a resistor of high resistance connected between the reference voltage source and the gate electrode, to derive the preset offset potential from the reference potential.

8 Claims, 5 Drawing Sheets

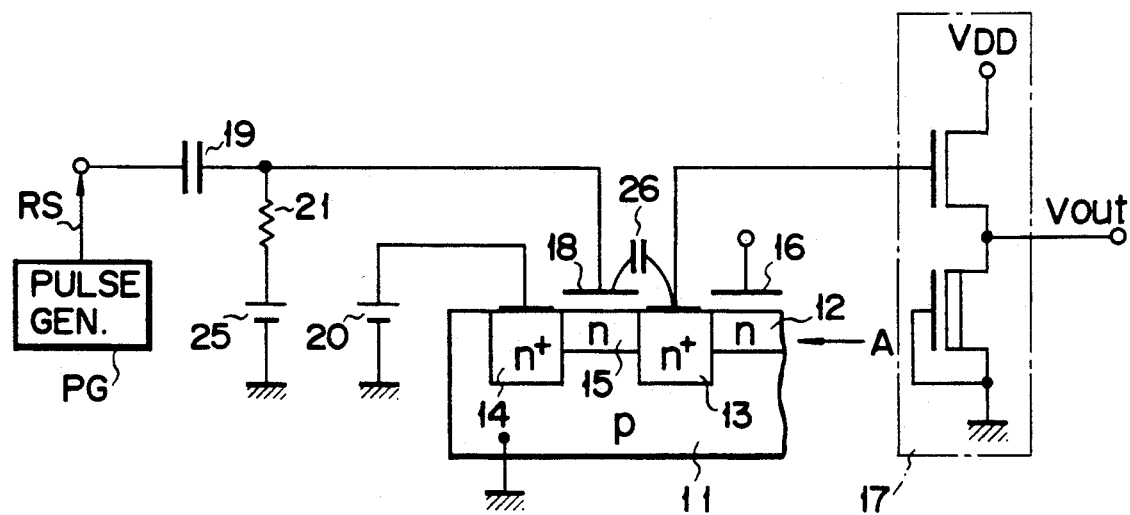
F I G. 1    (PRIOR ART)
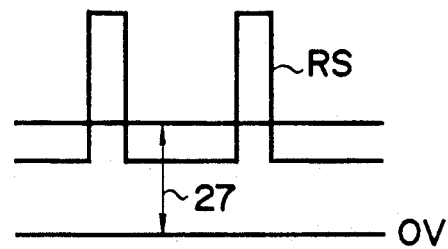
F I G. 2    (PRIOR ART)
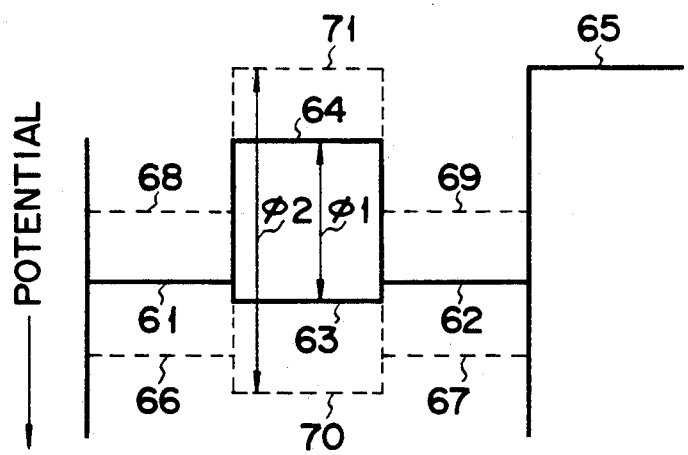
F I G. 3    (PRIOR ART)

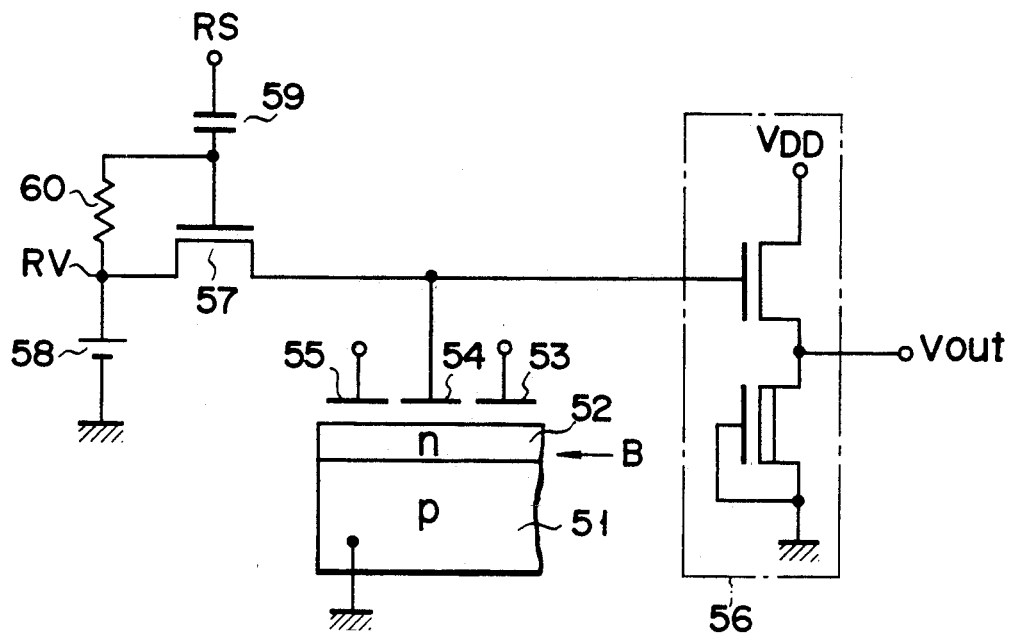
F I G. 8
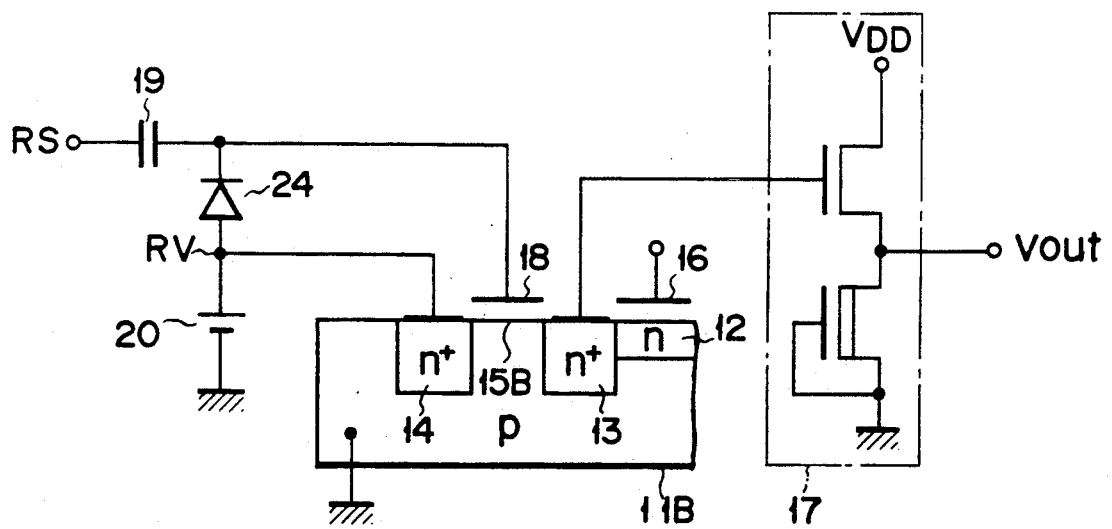
F I G. 9

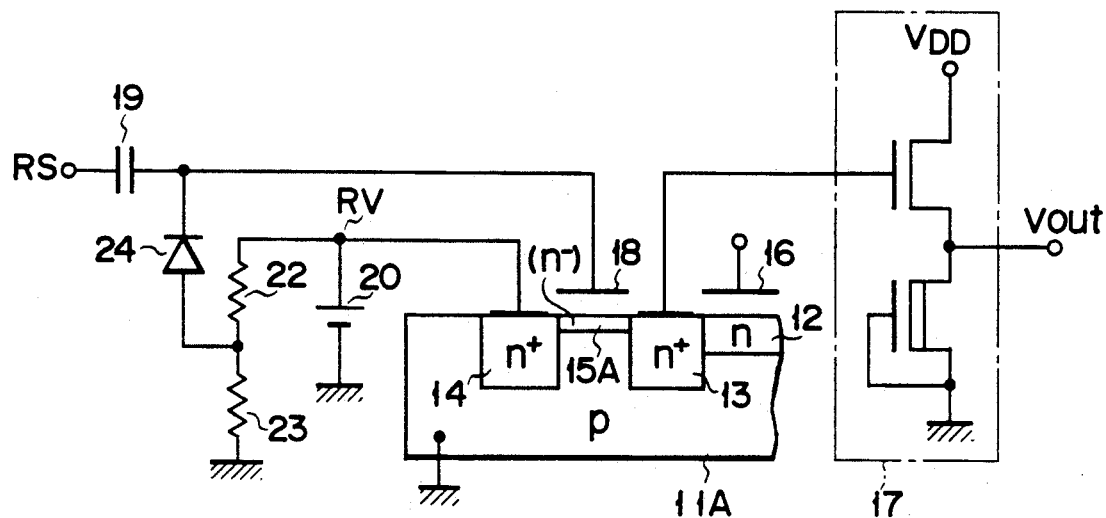
F I G. 10
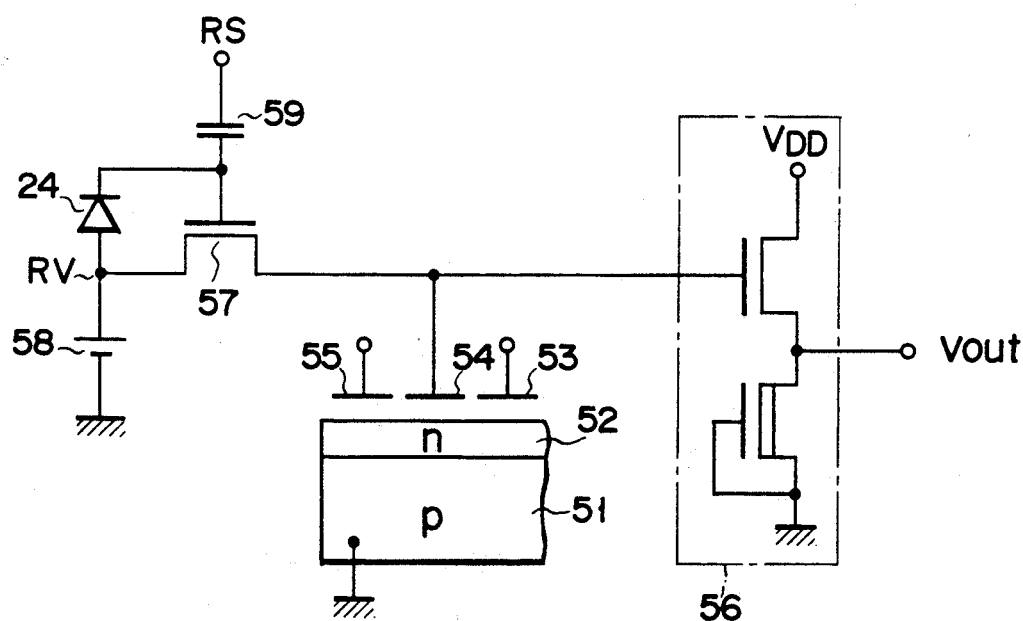
F I G. 11

CHARGE DETECTION CIRCUIT

This application is a continuation of application Ser. No. 144,339, filed Jan. 15, 1988, now abandoned.

BACKGROUND OF THE INVENTION

This invention relates to a charge transfer device, and more particularly to a charge detection circuit for detecting charges to be transferred in the form of a signal.

In the prior art solid state image sensor, a charge transfer device such as charge coupled device (CCD) is used to transfer charges obtained by photoelectric conversion process as charge packets. Each of the charge packets is converted to a voltage signal by the charge detection circuit positioned at one end of the CCD, and the voltage signal is used as an output signal of the solid state imaging device.

FIG. 1 is a circuit diagram of the prior art charge detection circuit using a floating diffusion region. This charge detection circuit includes n+-type floating diffusion region 13, n+-type reset drain region 14, and n-type reset channel 15 all of which are formed, by means of a diffusion process, in p-type semiconductor substrate 11 having an impurity concentration of $10^{15}$ cm$^{-3}$. The impurity concentration of n-type reset channel 15 is set at approx. $5 \times 10^{16}$ cm$^{-3}$.

The n-type transfer channel 12 of the charge detection circuit is formed, by means of a diffusion process, in the surface area of semiconductor substrate 11 such that it is in contact with floating diffusion region 13 The impurity concentration of transfer channel 12 is set at equal to that of reset channel 15. Transfer gate electrodes are insulatively formed over transfer channel 12 and arranged in a direction indicated by arrow A. One of the transfer gate electrodes, which is located at one end of the transfer channel, is used as output gate electrode 16. Charges obtained by means of a photoelectric conversion process are supplied as a charge packet to one end of transfer channel 12, and then transferred in transfer channel 12 under the control of the transfer gate electrodes. When the charge packet is transferred to the other end of transfer channel 12, it is fed from transfer channel 12 into floating diffusion region 13. Floating diffusion region 13 forms a pn junction in cooperation with p-type substrate 11. Therefore, the packet charge can be stored in region 13, due to the presence of the pn junction capacitance and parasitic capacitance associated therewith. The potential of region 13 is determined by the amount of charges stored therein. Source follower amplifier 17 is used to generate voltage signal Vout corresponding to the potential of floating diffusion region 13.

The charge detection circuit additionally includes reset gate electrode 18 which is insulatively formed over reset channel 15. Reset pulse signal RS from pulse generator PG is supplied to reset gate electrode 18 via capacitor 19. When signal RS is at a high potential level, reset channel 15 is set at high potential and to the conductive state in which floating diffusion region 13 and reset drain region 14 are electrically connected to each other. At this time, the charge stored in floating diffusion region 13 is discharged via reset channel 15 into reset drain region 14 which is kept at a potential equal to preset reference potential generated from reference voltage source 20.

In the above-described charge detection circuit, n-type diffusion regions are used to provide transfer channel 12 and reset channel 15 a so-called buried type channel structure. Employing the buried type channel structure enables the voltage applied to reset gate electrode 18—so as to set reset channel 15 into the conductive state, electrically connecting floating diffusion region 13 and reset drain region 14—to be set as low possible.

As is shown in FIG. 1, parasitic capacitor 26 is formed between floating diffusion region 13 and reset gate electrode 18. Therefore, when reset pulse signal RS is changed from the high potential level to the low potential level, to electrically isolate floating diffusion region 13 from reset drain region 14, the potential of floating diffusion region 13 will be shifted due to the rapid variation in the potential level of reset pulse signal RS. Thus, it is necessary to suppress the degree of potential shift to as great an extent as possible. In addition, it is important that reset channel 15 be set in the highly conductive state so that the charge of the charge packet be fully discharged. For this reason, in the prior art, the potential amplitude of reset pulse signal RS is set small, and offset voltage source 25 is provided in addition to reference voltage source 20, to supply an offset voltage which is superposed on pulse signal RS via resistor 21 of high resistance.

FIG. 2 is a waveform diagram of a voltage signal applied to reset gate electrode 18, with RS denoting a reset pulse signal and numeral 27 denoting an offset potential provided by offset voltage source 25. In other words, the signal applied to reset gate electrode 18 is a pulse signal which is biased by the offset potential.

FIG. 3 is a diagram showing the potential distribution of the respective semiconductor regions in the charge detection circuit. In FIG. 3, numeral 61 indicates the potential of reset drain region 14 set to the reference potential, 62 the potential of floating diffusion region 13 transmitted from reset drain region 14 via reset channel 15, 63 the potential of reset channel 15 in the conductive period which is specified by setting reset gate electrode 18 at a high potential, 64 the potential of reset channel 15 in a period in which floating diffusion region 13 is set in the electrically floating condition by setting reset gate electrode 18 at a low potential level, and 65 the potential of transfer channel 12. Assume now that reset pulse signal RS is set low to keep floating diffusion region 13 in the electrically floating condition. When a charge packet is supplied from transfer channel 12 to region 13, the potential of floating diffusion region 13 is changed according to the amount of charges in the charge packet. The potential change is amplified by amplifier 17 and supplied to the exterior.

In the case where the potential amplitude of reset pulse signal RS is reduced to as low a level as possible, it is necessary to take the reduction limit thereof into consideration, which limit is determined by the following relation. That is, the high potential of signal RS must be set to such a potential level that the potential of reset channel 15 may be set higher than the reference potential (potential 61 of reset drain region 14) when signal RS is supplied to reset gate electrode 18. Further, the low potential of signal RS must be set to such a potential level that the potential of floating diffusion region 13 may be set lower than that of reset channel 15 when a charge packet of maximum permissible amount of charges is supplied to floating diffusion region 13. In FIG. 3, $\phi 1$ indicates the minimum potential amplitude of potential at reset channel 13. In practice, it is necessary for reset pulse signal RS to have a potential amplitude of $\phi 1/\gamma$. In this case, $\gamma$ is a modulation coefficient of the reset channel potential with respect to variation in the reset gate potential and the value of $\gamma$ is generally set at 0.8 to 0.9.

Unless reference voltage source 20 and offset voltage source 25 are formed to satisfy special specifications, the output voltages thereof will fluctuate in the range of $\pm 5\%$. In a typical charge detection circuit, it is a common practice to use 15 V as an output voltage of reference voltage source 20 and 5 V as an output voltage of offset voltage source 25. Therefore, an output voltage of reference voltage source 20 will fluctuate in the range of $\pm 0.75$ V and an output voltage of offset voltage source 25 will fluctuate in the range of $\pm 0.25$ V. In FIG. 3, 66 and 67 indicate a reference potential of $+15.75$ V, and 68 and 69 indicate a reference voltage of $+14.25$ V. In the actual circuit design, it is necessary to determine the potential amplitude $\phi 2$ of the reset channel so that the conduction state can be reliably controlled even when the reference potential is changed as described above. To meet the requirement, the potential amplitude of reset pulse signal RS is determined to $\phi 1/\gamma + 0.75$ V $\times 2 + 0.25$ V $\times 2$ or $\phi 1/\gamma + 2$ V. In FIG. 3, 70 and 71 indicate the reset channel potential set in the case where the potential amplitude of the reset pulse signal is determined with the fluctuation in the power source voltage taken into consideration. In general, since $\phi 1/\gamma$ is set at 3 to 4 V, a circuit for generating reset pulse signal RS can be operated on a power source voltage of 5 V used to operate TTL circuits o the like. With the fluctuation of the power source voltage taken into consideration, it is necessary to use a power source voltage exceeding 5 V as $\phi 2/\gamma$. Further, reset channel 15 is formed of an n-type diffusion region to have a buried channel structure so that the reset channel potential may vary by $+0.5$ V with respect to the potential of the reset gate electrode in the case where fluctuation occurs in the manufacturing process, the characteristic of the material and the like. Therefore, it is necessary to further increase $\phi 2/\gamma$ by 1 V. As a result, it is necessary to use an exclusive power source in order to operate the circuit for generating reset pulse signal RS in the prior art.

As has been described above, two power sources, i.e., a reference voltage source and an offset voltage source, are used to operate the prior art charge detection circuit. In addition, output voltages of the two power sources differ from each other. Therefore, it is necessary to set the amplitude of the reset pulse signal at a high level when the fluctuation in the output voltages is taken into consideration, making it difficult to reduce the size of the prior art charge detection circuit.

SUMMARY OF THE INVENTION

An object of this invention is to provide a charge detection circuit which can be operated by a control signal of a relatively low potential amplitude, irrespective of fluctuation in the power source potential.

This object can be attained by a charge detection circuit which comprises a semiconductor substrate of a first conductivity type, a reference voltage source for generating a reference voltage having a predetermined voltage difference with respect to the potential of the semiconductor substrate, a first semiconductor region of a second conductivity type, formed in the semiconductor substrate so as to store a carrier packet, a second semiconductor region of the second conductivity type, formed in the semiconductor substrate and connected to the reference voltage source, so as to be kept at a potential substantially equal to the reference potential, an MOS type transfer gate having a channel formed between the first and second semiconductor regions, and a gate electrode insulatively formed over the channel in order to transfer the carrier packet from the first semiconductor region to the second semiconductor region, a potential detection circuit for detecting the potential of the first semiconductor region, the potential thereof being determined o the basis of the amount of carriers in the carrier packet, a signal supply section for supplying a control potential signal to the gate electrode, to control the conduction state of the transfer gate, and a biasing circuit connected between the reference voltage source and the gate electrode, thereby to bias the potential of the gate electrode according to a preset offset potential derived from the reference potential.

In the charge detection circuit of this invention, the reference voltage source is used not only to set the potential of the first semiconductor region to the reference potential of the second semiconduction region when the transfer gate is set in the conductive state, but also to bias the potential of the gate electrode of the transfer gate. As a result, it is then possible to reduce the amplitude of the control potential signal to a theoretically minimum value. It is no need to take the potential fluctuation in the reference voltage source into consideration. In addition, the use of a single voltage source enables the size of the detection circuit to be reduced.

BRIEF DESCRIPTION OF THE DRAWINGS

FIG. 1 is a circuit diagram of the prior art charge detection circuit using a floating diffusion region;

FIG. 2 is a waveform diagram of a potential signal applied to a reset gate electrode shown in FIG. 1;

FIG. 3 is a diagram showing the potential state of each of the semiconductor regions shown in FIG. 1;

FIG. 8 is a circuit diagram of a charge detection circuit according to a third embodiment of this invention in which the charge packet is not destroyed even after it is read out; and FIGS. 9 to 11 are circuit diagrams of charge detection circuits according to fourth to sixth embodiments of this invention in which a reset pulse is biased via a diode.

DETAILED DESCRIPTION OF THE PREFERRED EMBODIMENTS

An embodiment of this invention will now be described, with reference to the drawings.

Figure 4:
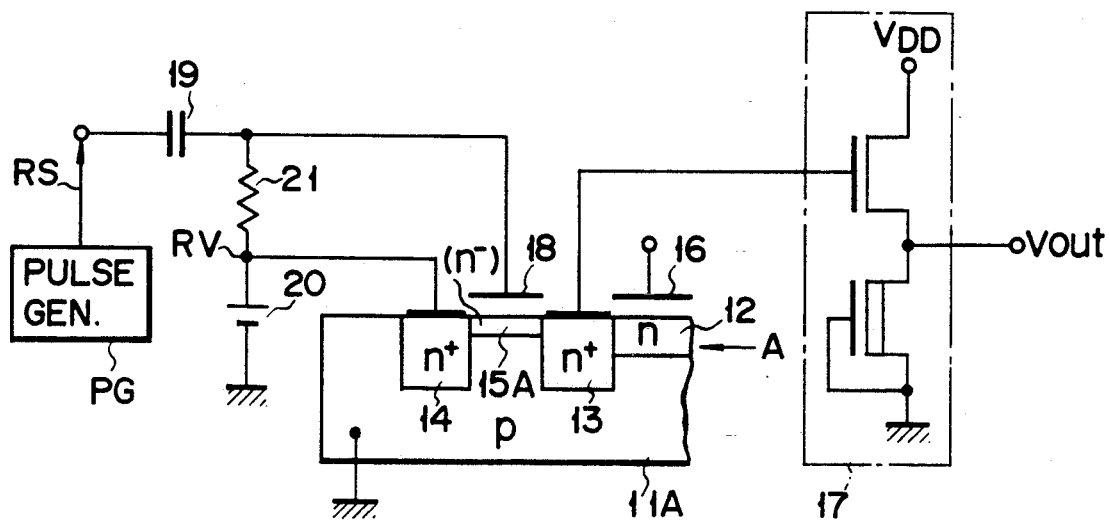
FIG. 4 is a circuit diagram of a charge detection circuit according to one embodiment of this invention.

FIG. 4 is a circuit diagram showing the construction of a charge detection circuit according to a first embodiment of this invention. As in the case of the prior art circuit, the circuit of this embodiment too has a floating diffusion region, and includes transfer channel 12, floating diffusion region 13, reset drain region 14, and reset channel 15A which are formed in the surface of p-type semiconductor substrate 11A having an impurity concentration of $10^{15}$ cm$^{-3}$. Transfer channel 12 is an n-type diffusion region having an impurity concentration of $5 \times 10^{16}$ cm$^{-3}$, while reset channel 15A is an n$^-$-type diffusion region having an impurity concentration of $2 \times 10^{15}$ cm$^{-3}$ which is formed by doping n-type impurity into the surface of semiconductor substrate 11A at a dose of $7 \times 10^{11}$ cm$^{-2}$. Floating diffusion region 13 and reset drain region 14 are n$^+$-type diffusion regions having the same impurity concentration, which is higher than that of transfer channel 12.

Transfer gate electrodes are insulatively formed over transfer channel 12 and arranged in the direction indicated by arrow A. One of the transfer gate electrodes which is placed nearest to floating diffusion region 13 is used as output gate electrode 16. Electrode 16 is set at a potential of a constant level.

In the charge detection circuit of FIG. 4, floating diffusion region 13 forms a pn junction in cooperation with p-type semiconductor substrate 11A, and charges of each charge packet transferred from transfer channel 12 are stored in the pn junction capacitor and a parasitic capacitor associated with floating diffusion region 13. Source follower type amplifier 17 is provided to generate voltage signal Vout corresponding to the potential of floating diffusion region 13.

The charge detection circuit further includes reset gate electrode 18 insulatively formed over reset channel 15A. An input terminal for reset pulse signal RS is connected to reset gate electrode 18 via capacitor 19. The reset pulse signal is generated from pulse generator PG. Further, reset drain region 14 is connected to output terminal RV of reference voltage source 20 for generating a preset reference potential of, for example, 15 V. Output terminal RV of reference voltage source 20 is also connected to reset gate electrode 18 via resistor 21 of high resistance with several tens to several hundreds K$\Omega$. Reset pulse signal RS is biased by the reference potential serving as an offset potential.

In this embodiment, reset pulse signal RS is biased by a potential supplied from reference voltage source 20 which is as high as 15 V. Therefore, reset channel 15A which has an impurity concentration lower than that in the prior art case is formed in order to attain a channel potential which can be properly set with respect to that of the reset gate electrode. This permits the potential of the reset channel to be smaller in the absolute value than that of the reset gate electrode.

The basic operation of the charge detection circuit with the construction as described above may be effected in the same manner as in the prior art case. That is, when a charge packet is transferred from transfer channel 12 to floating diffusion region 13 under the control of output gate electrode 16, the potential of floating diffusion region 13 is changed according to the amount of charges in the charge packet. The potential variation is amplified by amplifier 17 and is supplied as voltage signal Vout to the exterior. Then, reset channel 15A is set into the conductive state, permitting the charge to be discharged from floating diffusion region 13 to reset drain region 14.

Since reset pulse signal RS is biased by the potential of reference voltage source 20 connected to reset drain region 14, the D.C. bias potential of a signal applied to reset gate electrode 18 will be changed by the same degree of variation in the potential of reset drain region 14 which is caused by the potential fluctuation of reference voltage source 20. In other words, the relative potential difference between the potentials of the reset drain region and the reset channel is not changed even when the potential of reference voltage source 20 is changed. Therefore, the potential amplitude of reset pulse signal RS can be determined without taking the power source voltage variation into consideration and set to a theoretically minimum value. Thus, it is possible to derive reset pulse signal RS using a power source which generates 5 V for operating logic circuits such as TTL circuits, making the circuit construction simple.

Figure 5:
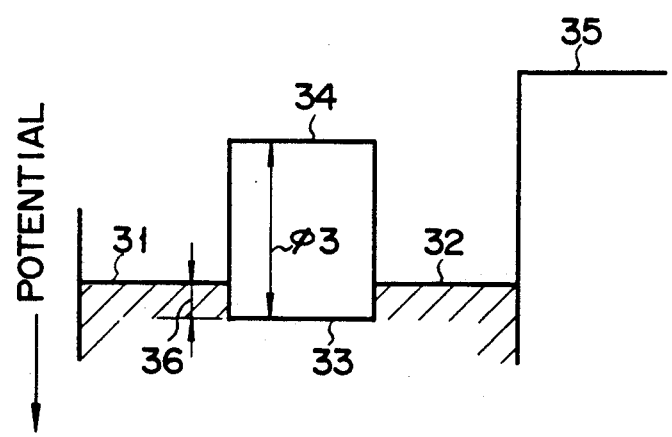
FIG. 5 is a diagram showing the potential state of each of the semiconductor regions shown in FIG. 4.

FIG. 5 is a diagram showing the potential state of the semiconductor regions in the charge detection circuit of the embodiment described above. In FIG. 5, 31 indicates the potential of reset drain region 14 which is set to the reference potential, 32 the potential of floating diffusion region 13 which is transmitted from reset drain region 14 via reset channel 15A, 33 the potential of reset channel 15A in the conductive state set by setting reset gate electrode 18 at a high potential, 34 the potential of reset channel 15A in a period in which floating diffusion region 13 is set in the floating state by setting reset channel 18 at a low potential, 35 the potential of transfer channel 12, 36 the potential difference between potential 31 of reset drain region 14 and high potential 33 of reset channel 15A, and $\phi 3$ the potential amplitude of reset channel 15A.

Now, the effect attained by the circuit of the embodiment described above is explained with reference to FIG. 5. When potential 31 of the reset channel is changed due to fluctuation of the power source voltage, potentials 33 and 34 of the reset channel are changed by the same degree as variation in potential 31. Therefore, potential difference 36 between potentials 31 and 33 of the reset drain region and reset channel can be determined without paying any attention to fluctuation in the power source voltage.

Figure 6:
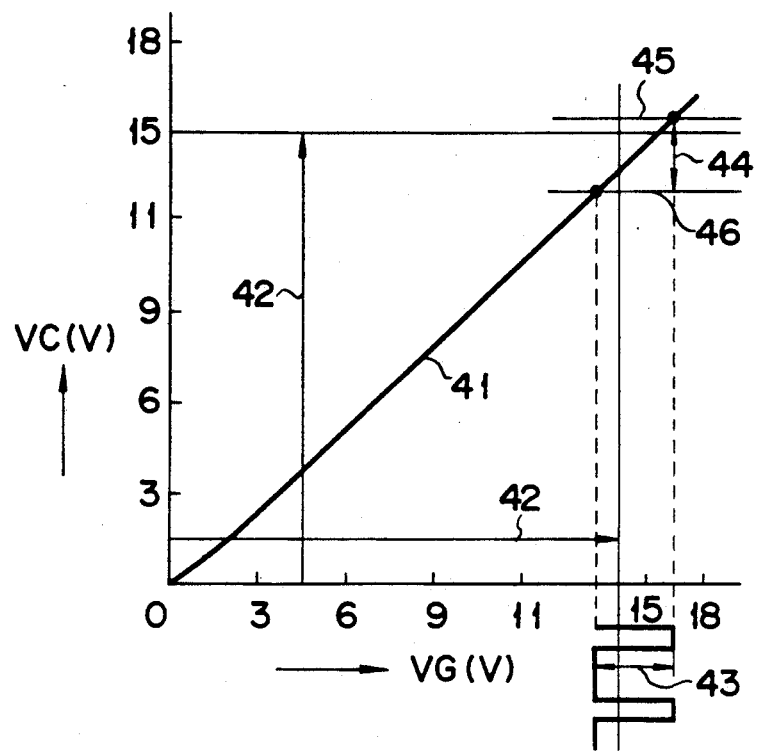
FIG. 6 is a characteristic diagram showing the relation between the potential VC of the reset channel and the potential VG of the reset gate electrode shown in FIG. 4.

FIG. 6 is a characteristic diagram showing the relation between potential VG (V) of reset gate electrode 18 and potential VC (V) of reset channel 15A in the embodiment described above. In FIG. 6, 41 indicates a curve showing the relation between potential VG of the reset gate electrode and potential VC of the reset channel, 42 the reference potential of reference voltage source 20, 43 the potential amplitude of reset pulse signal RS, and 44 is $\phi 3$ indicating variation in the potential of the reset channel corresponding to potential amplitude 43. In this case, if reset channel 15A is set at high potential 45 higher than reference voltage 42, floating diffusion region 13 and reset drain region 14 are electrically connected to each other in FIG. 4, permitting the charge to be discharged. In contrast, when reset channel 15A is set at low potential 46, the maximum amount of detection charges can be attained by a properly determined potential difference between low potential 46 and reference potential 42. (Where, the maximum amount of detection charges denotes the theoretical maximum amount of charges which region 13 can store.)

Further, in this embodiment, since semiconductor substrate 11A is formed to have an impurity concentration of $10^{15}$ cm$^{-3}$, n-type impurity is doped into semiconductor substrate 11A to form reset channel 15A. However, if a p-type semiconductor substrate with a low impurity concentration of, for example, $10^{14}$ cm$^{-3}$ is used, reset channel 15A may be formed in the form of a surface channel structure. In this case, n-type impurity is not doped into the p-type semiconductor substrate and part of the surface of the semiconductor substrate is used as the reset channel.

Figure 7:
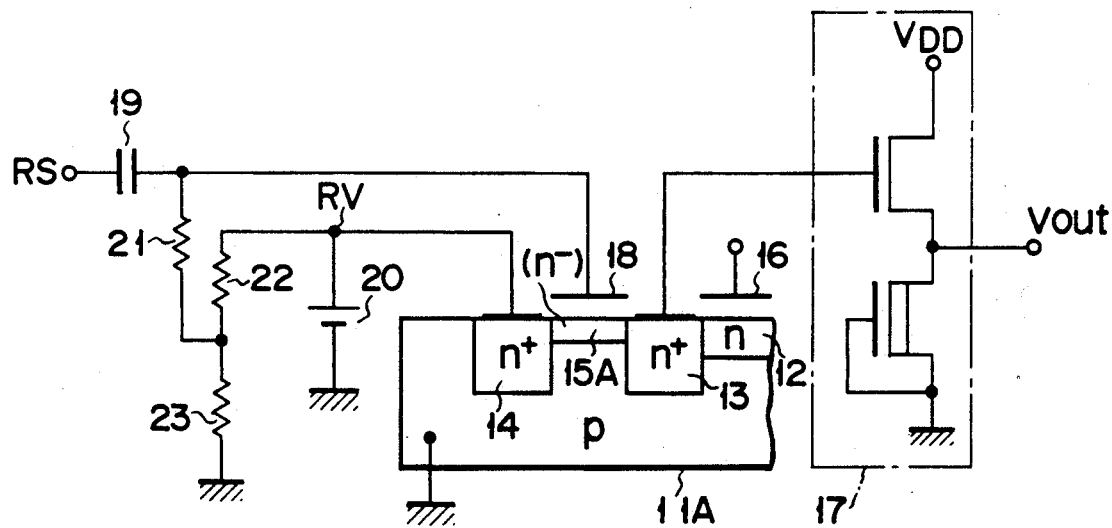
FIG. 7 is a circuit diagram of a charge detection circuit according to a second embodiment of this invention in which the reference potential is divided according to the resistance ratio to provide an offset potential.

FIG. 7 is a circuit diagram showing the construction of the charge detection circuit according to a second embodiment of this invention in which a floating diffusion region is used as in the detection circuit of the first embodiment. The charge detection circuit of this embodiment is similar to that of the first embodiment except that an offset potential is not derived directly from the reference potential of reference voltage source 20 but is obtained by dividing the reference potential by a potential divider of resistors 22 and 23 which have the resistance ratio of 1:4, for example.

The charge detection circuit of this embodiment is superior to that of the first embodiment in that the offset potential can be selectively set by changing the resistance ratio of resistors 22 and 23. However, in this case, if the reference potential of reference voltage source 20 is varied, the offset potential will be varied by an amount obtained by multiplying the resistance ratio of resistors 22 and 23 by the variation of the reference potential. In order to suppress the variation of the offset potential as small as possible, it is preferable to set the offset potential as close to the reference potential as possible.

FIG. 8 is a circuit diagram showing the construction of a charge detection circuit according to a third embodiment of this invention. The charge detection circuit of this embodiment includes a floating gate electrode to detect the amount of charges in the charge packet. The charge detection circuit of the first and second embodiments are of a destructive detection type in which each charge packet is discharged into the reset channel after the charge amount thereof is detected. In contrast, the charge detection circuit of this embodiment is of a non-destructive detection type in which the charge amount of each charge packet can be detected without destroying the charge packet. That is, the charge detection circuit includes n-type transfer channel 52 formed in the surface of p-type substrate 51, output gate electrode 53 formed over transfer channel 52, floating gate electrode 5 for signal charge detection, and transfer gate electrode 55, which are arranged in this order. The charge packet is transferred in transfer channel 52 in a direction indicated by arrow B. When the charge packet is stored in those portions of transfer channel 52 which locate under floating gate electrode 54, then the potential of floating gate electrode 54 is varied according to the charge amount of the charge packet. The potential variation is amplified by source follower type amplifier 56 and is supplied as voltage signal Vout to the exterior. After the potential variation of the floating diffusion region is detected, the charge packet is transferred under the control of transfer gate electrode 55 to that portion of transfer channel 52 which lies under gate electrode 55, and then transferred to a desired position (not shown) via transfer channel 52.

MOS gate 57 shown in FIG. 8 corresponds to the reset channel in the charge detection circuit of the first and second embodiments and is made conducive to reset the potential of floating gate electrode 54. The current path of MOS gate 57 is, at one end, connected to floating gate electrode 54 and, at the other end, connected to output terminal RV of reference voltage source 58. Further, a gate electrode of MOS gate 57 is connected to the input terminal for receiving reset pulse signal RS via capacitor 59 and to output terminal RV of reference voltage source 58 via resistor 60 with a high resistance of several tens to several hundreds KΩ, for example, 100 KΩ. Thus, reset pulse signal RS is biased by the potential of reference voltage source 58.

In the charge detection circuit of this embodiment, since an output potential of reference voltage source 58 is used as an offset potential a in the former embodiments, the amplitude of reset pulse signal RS can be set to the minimum value which is theoretically attained without taking fluctuation in the power source voltage into consideration.

FIGS. 9 to 11 are circuit diagrams showing the constructions of charge detection circuits according to fourth to sixth embodiments. In the charge detection circuits of the first to third embodiments, reset pulse signal RS is biased by applying the reference potential as an offset potential via resistor 21 or 60. However, it is also possible to use diode 24 instead of resistor 21 or 60 in order to bias reset pulse signal RS as shown in FIGS. 9 to 11. In this case, since the D.C. bias potential of the reset gate electrode becomes higher than in the case where the resistor of high resistance is used to bias the reset pulse signal, it becomes necessary to adjust or select the impurity concentration and conductivity type of the reset channel according to the degree of rise of the D.C. bias potential.

What is claimed is:

1. A charge detection circuit, comprising:
   a semiconductor substrate of a first conductivity type;
   a reference voltage source for generating a reference potential having a predetermined voltage difference with respect to the potential of said semiconductor substrate;
   a first semiconductor region of a second conductivity type formed in said semiconductor substrate as a floating diffusion region for storing a carrier packet, the potential of said first semiconductor region being determined according to the number of carriers in said carrier packet;
   potential detection means for detecting the potential of said first semiconductor region;
   a second semiconductor region of the second conductivity type formed in said semiconductor substrate and connected to said reference voltage source, the potential of said second semiconductor region being set substantially equal to said reference potential;
   a MOS type transfer gate having a channel formed between said first and second semiconductor regions and a gate electrode insulatively formed over said channel;
   signal means, coupled to said MOS type transfer gate, for supplying a reset pulse signal to said gate electrode of said MOS type transfer gate to discharge said carrier pocket stored in said first semiconductor region to said second semiconductor region via said channel; and
   bias means for biasing the potential of said gate electrode of said MOS type transfer gate by a preset offset potential derived from said reference potential, said bias means including transfer means connected between said reference voltage source and said gate electrode of said MOS type transfer gate, for transferring said offset potential and for blocking said reset pulse signal from said signal semiconductor region connected to said reference voltage source;
   wherein said channel is a third semiconductor region having a impurity concentration which is required to be set, in absolute value, at a potential lower than that of said gate electrode in operation when the reset pulse signal is supplied to said gate electrode of said MOS type transfer gate.

2. A charge detection circuit according to claim 1, wherein said bias means includes voltage divider means, coupled to said reference voltage source, for dividing said reference potential to produce an output potential lower than said reference potential, and wherein said transfer means is coupled to said output potential of said voltage divider means to supply said output potential to said transfer gate as said preset offset potential.

3. A charge detection circuit according to claim 1, wherein said semiconductor substrate contains impurities of the first conductivity type at a concentration of about $10^{15}$ cm$^{-3}$, and said third semiconductor region contains impurities of the second conductivity type at a concentration of about $2 \times 10^{15}$ cm$^{-3}$.

4. A charge detection circuit according to claim 1, wherein said semiconductor substrate contains impurities of the first conductivity type at a concentration of about $10^{14}$ cm$^{-3}$, and said third semiconductor region is constituted by a portion of said semiconductor substrate.

5. A charge detection circuit according to claim 1, wherein said potential detection means includes an amplifier with a MOS transistor having a gate electrode connected to said first semiconductor region.

6. A charge detection circuit according to claim 5, wherein said signal supply means includes an input terminal to which a voltage pulse is selectively supplied as said control potential signal, and capacitive means connected between said input terminal and the gate electrode of said transfer gate.

7. A charge detection circuit according to claim 1 wherein said transfer means is resistive means.

8. A charge detection circuit according to claim 1 wherein said transfer means is diode means.

* * * * *